(12) United States Patent
Deng (10) Patent No.: US 12,471,423 B2
(45) Date of Patent: Nov. 11, 2025

(54) DISPLAY PANEL AND MANUFACTURING METHOD THEREOF

(71) Applicant: TCL CHINA STAR OPTOELECTRONICS TECHNOLOGY CO., LTD., Shenzhen (CN)

(72) Inventor: Hongzhao Deng, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/787,431

(22) PCT Filed: May 31, 2022

(86) PCT No.: PCT/CN2022/096426
§ 371 (c)(1),
(2) Date: Jun. 20, 2022

(87) PCT Pub. No.: WO2023/226068
PCT Pub. Date: Nov. 30, 2023

(65) Prior Publication Data
US 2024/0186469 A1   Jun. 6, 2024

(30) Foreign Application Priority Data

May 23, 2022 (CN) .......................... 202210565951.8

(51) Int. Cl.
*H10H 20/857* (2025.01)
*G02F 1/13357* (2006.01)
(Continued)

(52) U.S. Cl.
CPC ..... *H10H 20/857* (2025.01); *G02F 1/133603* (2013.01); *H01L 25/0753* (2013.01); *H10H 20/0364* (2025.01)

(58) Field of Classification Search
CPC ............ H10H 20/857; H10H 20/0364; H10H 20/036; H10H 20/85; G02F 1/133603; H01L 25/0753; H01L 25/167
See application file for complete search history.

(56) References Cited

U.S. PATENT DOCUMENTS

2004/0137707 A1* 7/2004 Lei .......................... H01L 24/13
257/E23.021
2011/0095194 A1* 4/2011 Orava ..................... H10F 30/29
204/192.1
(Continued)

FOREIGN PATENT DOCUMENTS

CN    111525016 A    8/2020
CN    111613714 A    9/2020
(Continued)

OTHER PUBLICATIONS

PCT International Search Report for International Application No. PCT/CN2022/096426, mailed on Nov. 25, 2022, 10pp.
(Continued)

*Primary Examiner* — Moazzam Hossain
(74) *Attorney, Agent, or Firm* — The Roy Gross Law Firm, LLC; Roy D. Gross (57) ABSTRACT

A display panel and a manufacturing method thereof are provided by the present application. The manufacturing method of the display panel includes providing a substrate, and the substrate includes conductive pads. A conductive material layer is formed on the substrate. The conductive material layer is patterned to form at least two conductive parts, the conductive parts are disposed on the conductive (Continued)

pads. At least one light-emitting diode device is provided on the conductive parts.

10 Claims, 4 Drawing Sheets

(51) Int. Cl.
  *H01L 25/075* (2006.01)
  *H10H 20/01* (2025.01)

(56) References Cited

U.S. PATENT DOCUMENTS

| | | | |
|---|---|---|---|
| 2012/0196396 | A1 | 8/2012 | Kuo et al. |
| 2017/0162552 | A1* | 6/2017 | Thompson ........... H10H 20/825 |
| 2018/0122787 | A1 | 5/2018 | Chu et al. |
| 2020/0388721 | A1* | 12/2020 | Chen ................... H10H 20/018 |
| 2021/0335759 | A1* | 10/2021 | Sang ................... H01L 25/0753 |
| 2024/0421271 | A1* | 12/2024 | Jeannin ............... H10H 20/857 |

FOREIGN PATENT DOCUMENTS

| | | |
|---|---|---|
| CN | 112447761 A | 3/2021 |
| CN | 112992879 A | 6/2021 |
| CN | 113099620 A | 7/2021 |
| CN | 113838963 A | 12/2021 |
| EP | 3399550 A1 | 11/2018 |
| JP | 2022060047 A | 4/2022 |

OTHER PUBLICATIONS

PCT Written Opinion of the International Search Authority for International Application No. PCT/CN2022/096426, mailed on Nov. 25, 2022, 7pp.

Chinese Office Action issued in corresponding Chinese Patent Application No. 202210565951.8 dated Mar. 8, 2025, pp. 1-8, 16pp.

Journal of Optoelectronics, Laser, vol. 23, No. 9, Sep. 2012. Title: Research on the anode patterning of the OLED-on-silicon microdisplay, 5pp.

\* cited by examiner

DISPLAY PANEL AND MANUFACTURING METHOD THEREOF

This application is a National Phase of PCT Patent Application No. PCT/CN2022/096426 having International filing date of May 31, 2022, which claims the benefit of priority of Chinese Application No. 202210565951.8, filed May 23, 2022, the contents of which are all incorporated herein by reference in their entirety.

BACKGROUND OF INVENTION

Field of Invention

The present application relates to a field of display technology, and in particular to a display panel and a manufacturing method thereof.

Description of Prior Art

Micro light-emitting diode (micro-LED) display panels or sub-millimeter light-emitting diodes (mini-LEDs) have become one of hotspots of future display technologies. Compared with current organic light-emitting diode (OLED) display panels and liquid crystal display (LCD) devices, they have advantages of fast response, high color gamut, high PPI, and low energy consumption.

However, micro-LED and mini-LED displays have many technical difficulties and technical complexities, and high-precision or high-speed transfer technology is an important technical bottleneck. Transfer technology includes brushing process of conductive part (conductive glue, solder paste, or flux, etc.). Among them, precision of the brushing process of the conductive part determines a size of a minimum pad that can be supported and a gap between two adjacent pads, which further affects a size of pitch, thereby determining a lower limit of the pitch of the mini-LED, therefore, the brushing process of high-precision conductive part has always been particularly important in an entire manufacturing process of the mini-LED. Now, a main process of brushing the conductive part is stencil printing, that is, using an opening of a stencil as a mask, and then using the brushing process to achieve frontal brushing on a surface of the stencil, there will be conductive part left in an area with the openings, thereby completing the brushing process of the conductive part. However, precision of stencil printing is not very high, and a low precision of the conductive part greatly limits a gap and size of the mini-LED pads. In addition, an existing conductive part brushing requires repeated process debugging, and is time-consuming and labor-intensive; and a biggest problem of stencil printing is that it relies on masks, and different products require different masks, which are difficult to share and need to be replaced frequently, which greatly increases process cost.

SUMMARY OF INVENTION

Embodiments of the present application provide a display panel and a manufacturing method thereof, which are used to solve a technical problem of low precision in an existing manufacturing method of conductive parts.

The present application provides a manufacturing method of a display panel, including following steps:
  providing a substrate, the substrate including conductive pads;
  forming a conductive material layer on the substrate;
  patterning the conductive material layer to form at least two conductive parts, the conductive parts are located on the conductive pads; and
  providing at least one light-emitting diode device on the conductive parts.

Optionally, in the embodiments of the present application, the step of patterning the conductive material layer to form the at least two conductive parts includes a following step:
  patterning the conductive material layer with a laser to form the at least two conductive parts.

Optionally, in the embodiments of the present application, the step of patterning the conductive material layer to form the at least two conductive parts includes following steps:
  providing a mask above the substrate, the mask including light-transmitting openings and non-light-transmitting parts, and the non-light-transmitting parts correspond to the conductive pads; and
  aligning the light-transmitting openings with a laser to remove the conductive material layer corresponding to the light-transmitting openings, thereby forming the conductive parts corresponding to the non-light-transmitting parts.

Optionally, in the embodiments of the present application, the step of patterning the conductive material layer to form the at least two conductive parts includes following steps:
  forming a photoresist layer on the conductive material layer;
  providing a mask above the conductive material layer, the mask including light-transmitting openings and non-light-transmitting parts;
  aligning the light-transmitting openings with a laser to remove the photoresist layer corresponding to the light-transmitting openings;
  patterning the conductive material layer with an etching process to form the at least two conductive parts; and
  peeling the photoresist layer corresponding to the non-light-transmitting parts.

Optionally, in the embodiments of the present application, the step of patterning the conductive material layer to form the at least two conductive parts includes following steps:
  forming a photoresist layer on the conductive material layer;
  providing a mask above the conductive material layer, the mask including light-transmitting openings and non-light-transmitting parts;
  aligning the light-transmitting openings with an ultraviolet light to remove the photoresist layer corresponding to the light-transmitting openings;
  patterning the conductive material layer with an etching process to form the at least two conductive parts; and
  peeling the photoresist layer corresponding to the non-light-transmitting parts.

Optionally, in the embodiments of the present application, the step of providing the substrate includes following steps:
  providing a base;
  forming a driving circuit layer on the base; and
  forming the conductive pads on a surface of the driving circuit layer away from the base.

Optionally, in the embodiments of the present application, the substrate includes a display area and a frame area, the conductive pads include at least one first conductive pad and a second conductive pad, a width of one of the first conductive pads is greater than a width of the second conductive pad, the at least one first conductive pad corresponds to the display area, the second conductive pad corresponds to the frame area; the conductive parts include at least one first conductive part and a second conductive part, and the at least one first conductive part is disposed on the at least one first conductive pad, the second conductive part is disposed on the second conductive pad.

Optionally, in the embodiments of the present application, after the step of patterning the conductive material layer to form the at least two conductive parts, the manufacturing method further includes a following step:

providing a driving chip on the second conductive part.

Optionally, in the embodiments of the present application, one of the at least one light-emitting diode device includes LED chips and connection pads disposed on the LED chips, and the step of providing the at least one light-emitting diode device on the conductive parts includes a following step:

providing the connection pads on the at least one first conductive part to form the display panel.

Correspondingly, the present application also provides a display panel, including:

a substrate, the substrate including conductive pads;
at least two conductive parts, the conductive parts disposed on the conductive pads, wherein the conductive parts are formed by patterning a conductive material layer; and
at least one light-emitting diode device, the at least one light-emitting diode device disposed on a side of the conductive parts away from the conductive pads.

Optionally, in the embodiments of the present application, the substrate includes:

a base;
a driving circuit layer, disposed on the base, wherein the conductive pads are disposed on a side of the driving circuit layer away from the base.

Optionally, in the embodiments of the present application, the substrate includes a display area and a frame area, the conductive pads include at least one first conductive pad and a second conductive pad, a width of one of the first conductive pads is greater than a width of the second conductive pad, the at least one first conductive pad corresponds to the display area, the second conductive pad corresponds to the frame area; the conductive parts include at least one first conductive part and a second conductive part, and the at least one first conductive part is disposed on the at least one first conductive pad, the second conductive part is disposed on the second conductive pad.

Optionally, in the embodiments of the present application, the display panel further includes a driving chip, and the driving chip is disposed on a side of the second conductive part away from the driving circuit layer.

Optionally, in the embodiments of the present application, the at least one light-emitting diode device includes LED chips and connection pads disposed on a side of the LED chips close to the substrate.

Optionally, in the embodiments of the present application, the display panel is used for direct display, and the LED chips are used for displaying images; or the display panel further includes a liquid crystal cell, the liquid crystal cell is disposed on the at least one light-emitting diode device, and the LED chips are used for providing a backlight light source.

Optionally, in the embodiments of the present application, the LED chips include micro-LED chips and mini-LED chips.

Optionally, in the embodiments of the present application, the display panel further includes a bonding layer, and the bonding layer is disposed between the substrate and the at least one light-emitting diode device for bonding the substrate and the at least one light-emitting diode device.

Optionally, in the embodiments of the present application, the conductive parts are formed by laser cutting the conductive material layer.

Optionally, in the embodiments of the present application, materials of the conductive parts include one or more of anisotropic conductive adhesive, anisotropic conductive adhesive, metal solder, solder paste, flux, and liquid metal.

Advantageous Effects

The embodiments of the present application provide the display panel and the manufacturing method thereof. The manufacturing method of the display panel includes providing a substrate, and the substrate includes conductive pads. Forming a conductive material layer on the substrate. Patterning the conductive material layer to form at least two conductive parts, the conductive parts being disposed on the conductive pads. And providing at least one light-emitting diode devices on the conductive parts. In the embodiment of the present application, by forming a conductive material layer on the substrate, and patterning the conductive material layer to form at least two conductive parts, compared with an existing technology of fabricating conductive parts by brushing, an improvement is greatly improved, and a precision of fabricating the conductive part is improved.

BRIEF DESCRIPTION OF DRAWINGS

In order to more clearly illustrate the embodiments or the technical solutions of the existing art, the drawings illustrating the embodiments, or the existing art will be briefly described below. The drawings in the following description merely illustrate some embodiments of the present application. Other drawings may also be obtained by those skilled in the art according to these figures without paying creative work.

DETAILED DESCRIPTION OF PREFERRED EMBODIMENTS

In order to make the objective, technical solution and advantages of the present application clearer, the present application will be further described in detail below with reference to the accompanying drawings. Referring to the figures in the accompanying drawings. The components with the same reference numbers represent the same or similar components. The following description is based on the illustrated specific embodiments of the present disclosure and should not be construed to limit the other specific embodiments which are not described in detail herein. The word "embodiment" configured in this specification means an example, example, or illustration.

In the description of the present disclosure, it is to be understood that the azimuth or positional relationships indicated by the terms "center", "longitudinal", "transverse", "length", "width", "thickness", "upper", "lower", "front", "back", "left", "right", "vertical", "horizontal", "top", "bottom", "inside", "outside", "clockwise", "counter-clockwise", etc., are based on the azimuth or positional relationship shown in the drawings, merely for the purpose of assisting and simplify the description, rather than indicating or implying that the indicated device or element must have a specific orientation, and be constructed and operated in a particular orientation. Therefore, these terms cannot be construed as limiting the present disclosure. In addition, the terms "first" and "second" are only configured for descriptive purposes and cannot be understood as indicating or implying relative importance or implicitly indicating the number of indicated technical features. Therefore, the features defined with "first" and "second" may explicitly or implicitly include one or more of the features. In the description of the present application, "a plurality of" means two or more than two, unless otherwise specifically defined.

Embodiments of the present application provide a display panel and a manufacturing method of thereof. Each will be described in detail below. It should be noted that the description order of the following embodiments is not intended to limit the preferred order of the embodiments.

The display panel provided by the present application will be described in detail below through specific embodiments.

Figure 1:
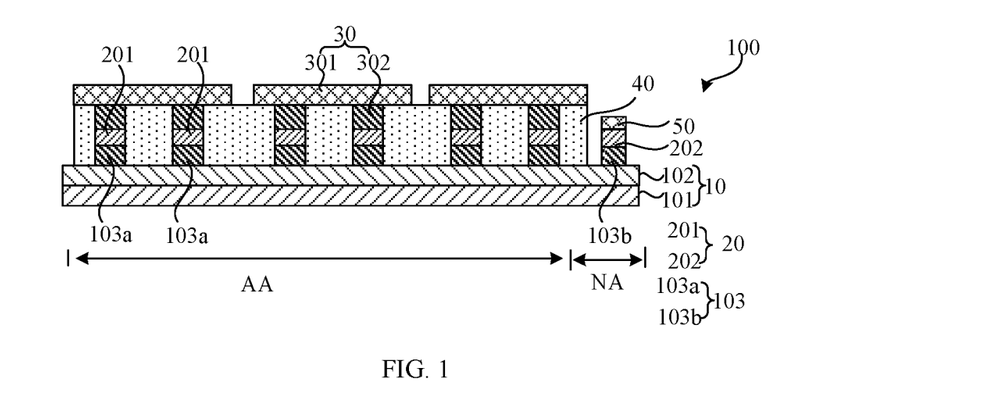
FIG. 1 is a schematic structural diagram of a display panel provided by an embodiment of the present application.

Embodiments of the present application provides a display panel. Please refer to FIG. 1, FIG. 1 is a schematic structural diagram of a display panel provided by an embodiment of the present application. The display panel 100 includes a substrate 10, at least two conductive parts 20, at least one light-emitting diode device 30, a bonding layer 40, and a driving chip 50. The conductive parts 20 are formed by patterning a conductive material layer.

In some embodiments, the conductive parts 20 are formed by laser cutting the conductive material layer.

The substrate 10 includes a display area AA and a frame area NA. The substrate 10 includes a base 101, a driving circuit layer 102, and conductive pads 103. The driving circuit layer 102 is disposed on the base 101. The conductive pads 103 are disposed on the driving circuit layer 102. The conductive pads 103 include at least one first conductive pad 103*a* and a second conductive pad 103*b*. The at least one first conductive pad 103*a* corresponds to the display area AA. The second conductive pad 103*b* corresponds to the frame area NA. The conductive parts 20 includes at least one first conductive part 201 and a second conductive part 202. The at least one first conductive part 201 is disposed on the at least one first conductive pad 103*a*. The at least one light-emitting diode device 30 is disposed on the at least one first conductive part 201. The second conductive part 202 is disposed on the second conductive pad 103*b*. The driving chip 50 is disposed on the second conductive part 202.

The at least one light-emitting diode device 30 include LED chips 301, and connection pads 302 disposed on the LED chips 301. The connection pads 302 are disposed on the at least one first conductive part 201. A manufacturing method of the display panel 100 will be described in detail below by using specific embodiments.

It should be noted that the display panel 100 of the embodiment of the present application may be used for direct display, and the LED chips 301 are used for displaying images.

In some embodiments, the display panel 100 may further include a liquid crystal cell disposed on the at least one light-emitting diode device 30. The LED chips 301 are used for providing a backlight source.

Figure 2:
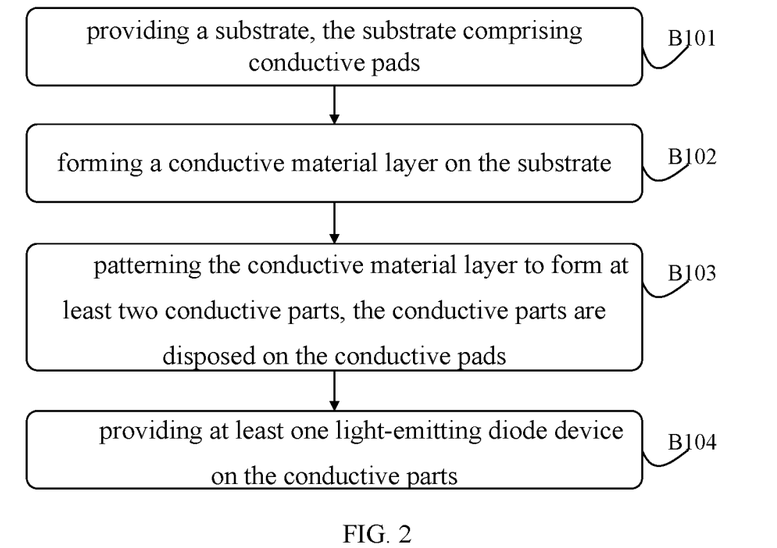
FIG. 2 is a step flow chart of a manufacturing method of the display panel provided by an embodiment of the present application.

Correspondingly, embodiments of the present application provide a manufacturing method of the display panel. Please refer to FIG. 2, FIG. 2 is a step flow chart of the manufacturing method of the display panel provided by an embodiment of the present application. The manufacturing method of the display panel includes providing a substrate, and the substrate includes conductive pads. Forming a conductive material layer on the substrate. Patterning the conductive material layer to form at least two conductive parts, the conductive parts are disposed on the conductive pads. And providing at least one light-emitting diode device on the conductive parts. In the embodiment of the present application, by forming a conductive material layer on the substrate, and patterning the conductive material layer to form the at least two conductive parts, compared with an existing technology of fabricating conductive parts by brushing, a precision of fabricating the conductive part is greatly improved.

The manufacturing method of the display panel provided by the embodiment of the present application will be described in detail below through specific embodiments.

Figure 3:
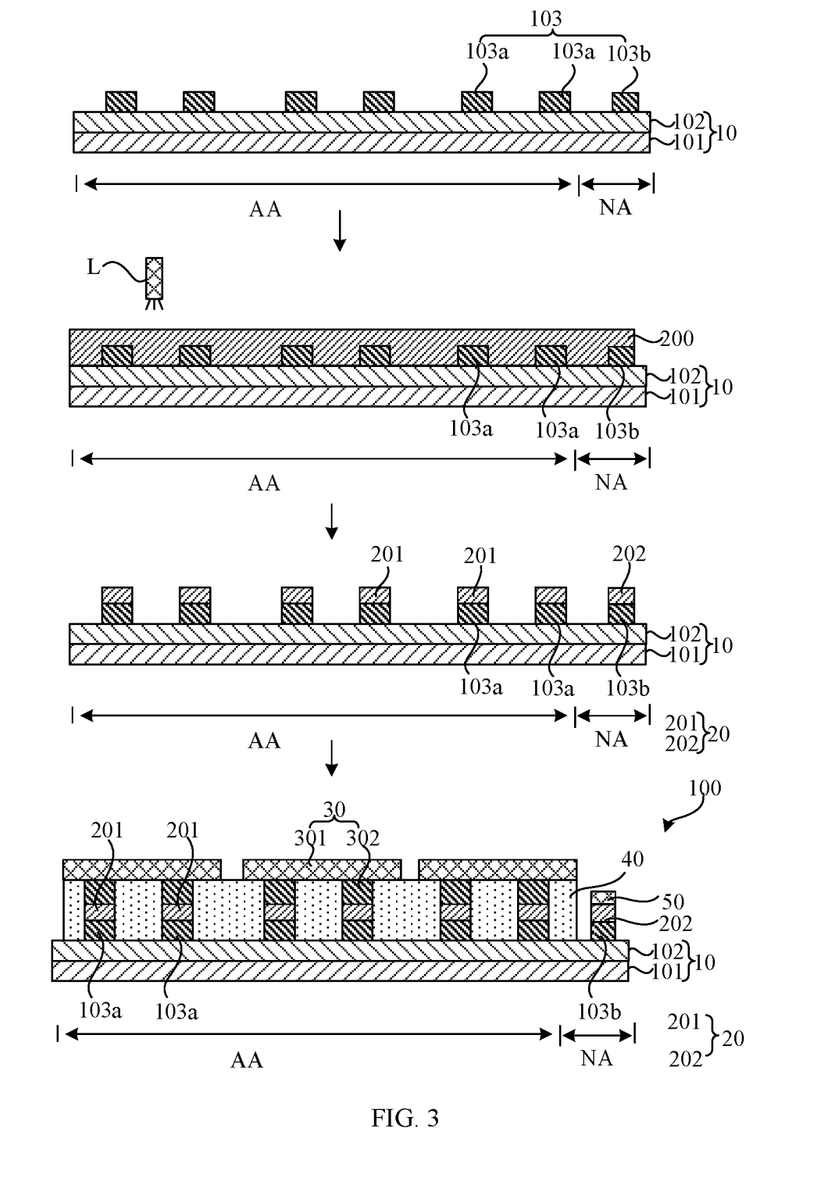
FIG. 3 is a first schematic diagram of the manufacturing method of the display panel provided by an embodiment of the present application.

An embodiment of the present application provides the manufacturing method of the display panel. Please refer to FIG. 3, FIG. 3 is a first schematic diagram of the manufacturing method of the display panel provided by an embodiment of the present application. The manufacturing method of the display panel includes following steps:

Step B101: providing a substrate 10, the substrate 10 includes conductive pads 103.

In some embodiments, the step B101 includes providing a base 101. Next, forming a driving circuit layer 102 on the base 101. Finally, forming the conductive pads 103 on a side of the driving circuit layer 102 away from the base 101.

Wherein, the base 101 may be a glass substrate, a bismaleimide triazine substrate, a printed circuit board substrate, or an aluminum substrate.

Wherein, the substrate 10 includes a display area AA and a frame area NA. The frame area NA is disposed on a side of the display area AA. The conductive pads 103 include at least one first conductive pad 103*a* and a second conductive pad 103*b*. The at least one first conductive pad 103*a* corresponds to the display area AA. The second conductive pad 103*b* corresponds to the frame area NA.

In some embodiments, the conductive pads 103 may be formed by a yellow light process.

Step B102: forming a conductive material layer 200 on the substrate 10.

In some embodiments, the conductive material layer 200 is formed on the substrate 10 using a process such as sputtering, or chemical vapor deposition.

Wherein, a material of the conductive material layer 200 may be selected from one or more of anisotropic conductive adhesive (ACA), anisotropic conductive binder, metal solder material, solder paste, flux, liquid metal, but is not limited to these.

Step B103: patterning the conductive material layer 200 to form at least two conductive parts 20. The conductive parts 20 are disposed on the conductive pads 103.

In some embodiments, the step B103 includes patterning the conductive material layer 200 with a laser L to form the at least two conductive parts 20.

First, cutting the conductive material layer 200 with the laser L to form two conductive parts 20 at an interval. Then, a laser light source is moved to a preset distance in an area where the conductive material layer 200 is located, and the laser light source is turned on again to illuminate the conductive material layer 200 to form the conductive parts 20. Wherein the preset distance is a horizontal distance between centers of two adjacent conductive parts 20. In the example of the present application, the conductive material layer 200 is directly irradiated by the laser. Since the laser has high energy, when the laser acts on a surface of the conductive material layer 200, the released energy melts and evaporates the conductive material layer 200 to achieve a purpose of cutting.

In some embodiments, a time of laser irradiation can be adjusted to prevent a phenomenon of cutting transition.

In some embodiments, after the step of forming the conductive parts 20, the substrate 10 may be treated with circulating air to remove re-solidified conductive particles on the substrate 10, so as to prevent the melted conductive material layer 200 from solidifying again at a low temperature, resulting in a short circuit of a device.

In some embodiments, the laser L may be any one of a laser, an excimer laser, or a solid-state laser.

In the embodiment of the present application, since a laser direct imaging technology has advantages of high precision, high speed, and high collimation, the conductive material layer 200 is cut by using the laser L as a light source to form a plurality of conductive parts 20 arranged in an array, and the precision of manufacturing the conductive parts 20 can be improved.

Wherein, the conductive parts 20 include at least one first conductive part 201 and a second conductive part 202. The at least one first conductive part 201 is disposed on the at least one first conductive pad 103a. The second conductive part 202 is disposed on the second conductive pad 103b.

In some embodiments, a width of one of the first conductive parts 201 is greater than a width of the second conductive part 202, therefore, when using the laser L to pattern the conductive material layer 200, only a cutting range of the second conductive part 202 needs to be enlarged. In the embodiment of the present application, the at least one first conductive part 201 and the second conductive part 202 can be formed by a single laser imaging process, which greatly shortens a production time and production cost of the display panel.

In some embodiments, after the step of patterning the conductive material layer 200 to form the at least two conductive parts 20, the manufacturing method further includes providing a driving chip 50 on the second conductive part 202. Wherein the driving chip 50 is used to drive the display panel to emit light.

Step B104: providing at least one light-emitting diode device 30 on the conductive parts 20.

The at least one light-emitting diode device 30 include LED chips 301 and connection pads 302 disposed on the LED chips 301. The step B104 includes providing the connection pads 302 on the at least one first conductive part 201 to form the display panel 100.

In some embodiments, the at least one light-emitting diode device 30 is mounted on the at least one first conductive part 201 by using surface mounted technology (SMT).

Wherein, the LED chips 301 may be mini-LED chips or micro-LED chips.

In some embodiments, one of the LED chips includes a base, a first electrode part, and a second electrode part. The first electrode part and the second electrode part protrude from a surface of the base close to the substrate 10. Wherein, a height of the second electrode part is lower than a height of the first electrode part. The connection pads 302 are disposed on the first electrode part and the second electrode part. When the LED chips 301 and the substrate 10 are bonded and pressed together, the first electrode part is pressed onto one of the first conductive parts 201. The second electrode part is pressed onto another one of the first conductive parts 201.

In some embodiments, after the step of providing the at least one light-emitting diode device 30 on the conductive parts 20, it may further include forming a bonding layer 40 between the at least one light-emitting diode device 30 and the substrate 10 to bond the substrate 10 and the at least one light-emitting diode device 30. The bonding layer 40 corresponds to the display area AA. The bonding layer 40 is used to closely bond the substrate 10 and the at least one light-emitting diode device 30 together, and at a same time completely wrap the at least one first conductive pad 103a, the at least one first conductive part 201, and the connection pads 302, which not only ensures the substrate 10 and the at least one light-emitting diode device 30 are closely bonded, enhancing a bonding reliability between the substrate 10 and the at least one light-emitting diode device 30, and at a same time, a protective layer is formed between the at least one first conductive part 201 and the connection pads 302 to block water and oxygen encroaching the at least one first conductive part 201 and the connection pads 302.

In some embodiments, the bonding layer 40 commonly uses organic silicone glue, acrylic glue, epoxy glue, polyurethane, etc.

In the manufacturing method of the display panel provided by the present application, the conductive material layer 200 is cut by using the laser imaging technology. Because the laser imaging process has the advantages of high precision, high speed, and high collimation, the conductive material layer 200 can be cut to form the plurality of conductive parts 20 with small gaps. Compared with a prior art in which the conductive part is fabricated by brushing, the precision of fabricating the conductive parts 20 is greatly improved, the pitch is further reduced, and the process cost is reduced. In addition, the manufacturing method of the display panel provided by the embodiment of the present application can realize a larger slope angle (tape) to meet diverse needs of customers, and the manufacturing method of the display panel provided by the embodiment of the present application has strong practicability and high production speed.

Figure 4:
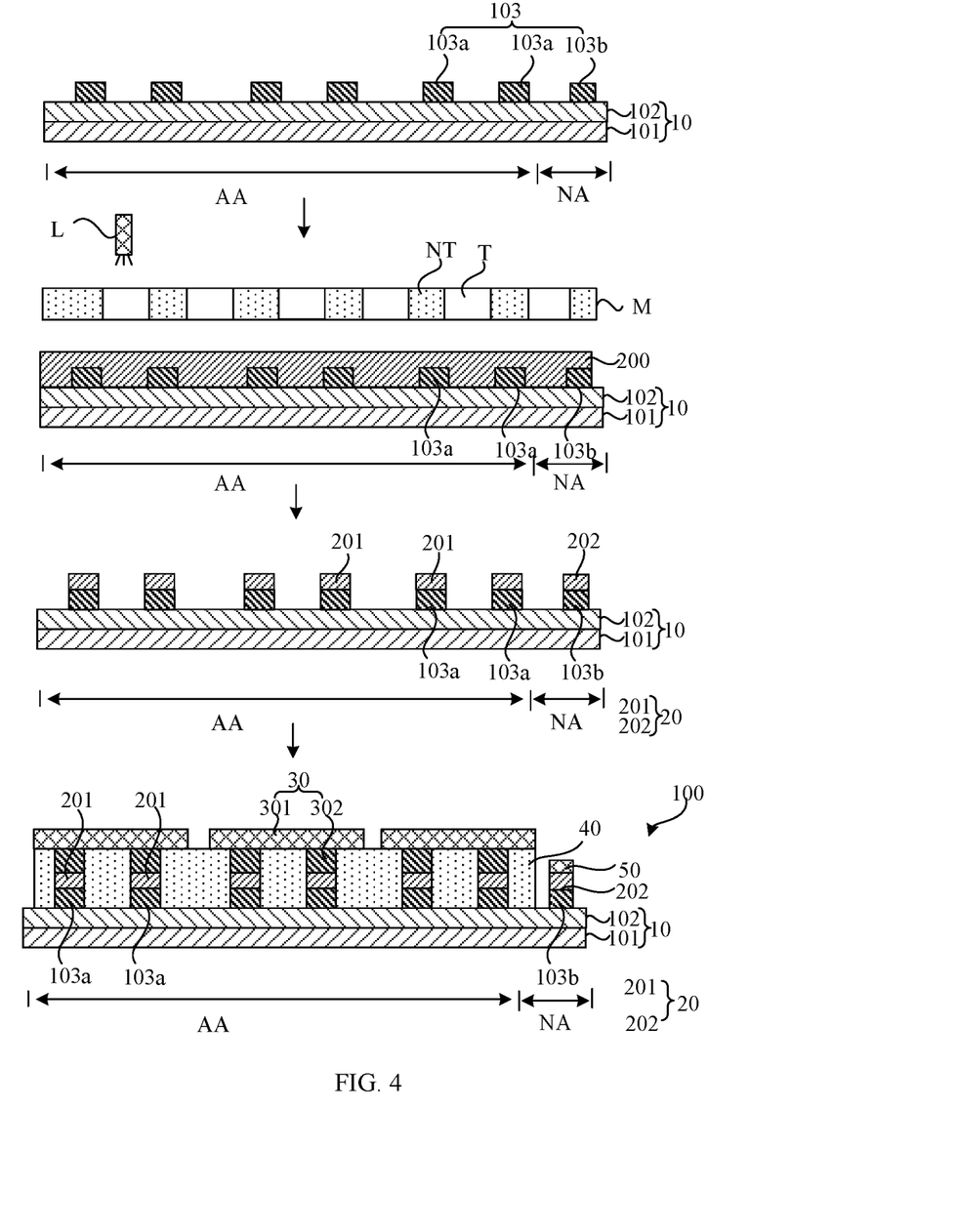
FIG. 4 is a second schematic diagram of the manufacturing method of the display panel provided by an embodiment of the present application.

Please refer to FIG. 4, FIG. 4 is a second schematic diagram of the manufacturing method of the display panel provided by an embodiment of the present application. A difference between the manufacturing method of the display panel provided by the embodiment of the present application and the manufacturing method of the display panel in FIG. 2 is that the step of patterning the conductive material layer 200 to form the at least two conductive parts 20 includes providing a mask M above the substrate 10, the mask M includes light-transmitting openings T and non-light-transmitting parts NT, and the non-light-transmitting parts NT correspond to the conductive pads 103. Aligning the light-transmitting openings T with the laser L to remove the conductive material layer 200 corresponding to the light-transmitting openings T, thereby forming the conductive parts 20 corresponding to the non-light-transmitting parts NT.

In the embodiment of the present application, the mask M is disposed above the substrate 10, so that the non-light-transmitting parts NT of the mask M correspond to the conductive pads 103, and then the laser L is used to align the light-transmitting openings T to remove the conductive material layer 200 corresponding to the light-transmitting openings T, thereby forming the conductive parts 20. That is, the step of patterning the conductive material layer 200 provided by the embodiment of the present application only needs to align the laser light source with the light transmission openings T and move the laser L in a plane where the mask is located to form the plurality of conductive parts 20 arranged in the array. Compared with the prior art in which the conductive part is fabricated by brushing, the precision of fabricating the conductive parts 20 is greatly improved, and the fabrication time of the display panel is greatly shortened. In some embodiments, the conductive parts 20 include at least one first conductive part 201 and a second conductive part 202, wherein the at least one first conductive part 201 are used to bind the at least one first conductive pad 103a and the connection pads 302. The second conductive part 202 corresponds to the frame area NA and is used to bind the driving chip 50 and the driving circuit layer 102 to drive the display panel 100 to display.

In some embodiments, the width of one of the first conductive parts 201 is greater than the width of the second conductive part 202, therefore, when setting the mask M, a width of the mask M of the non-light-transmitting parts NT corresponding to the second conductive pad 103b may be reduced, therefore, in the embodiment of the present application, the at least one first conductive part 201 and the second conductive part 202 can be formed by one laser imaging process, which greatly reduces the production time and production cost of the display panel.

Figure 5:
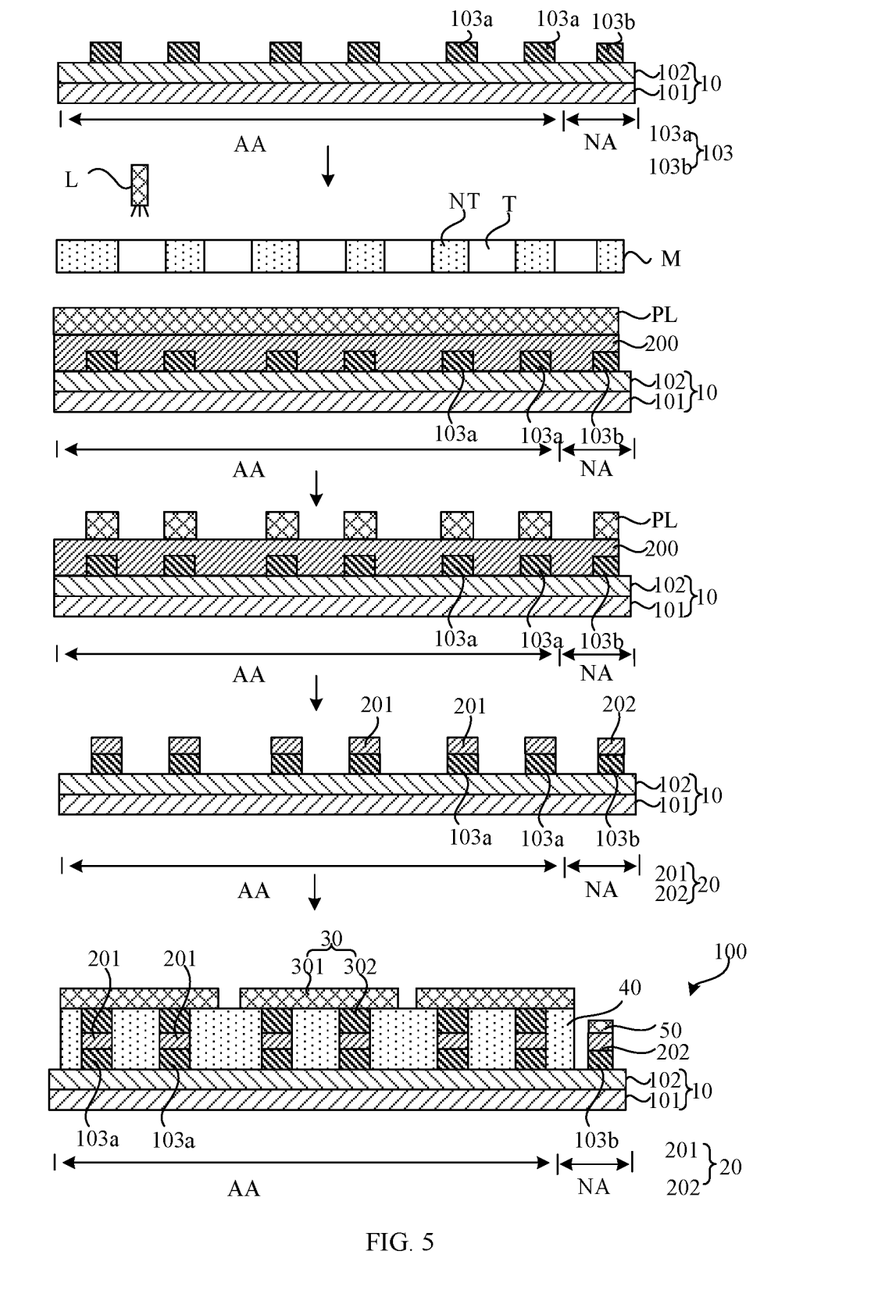
FIG. 5 is a third schematic diagram of the manufacturing method of the display panel provided by an embodiment of the present application.

Please refer to FIG. 5, FIG. 5 is a third schematic diagram of the manufacturing method of the display panel provided by an embodiment of the present application. A difference between the manufacturing method of the display panel provided by the embodiment of the present application and the manufacturing method of the display panel provided in FIG. 3 is that the step of patterning the conductive material layer 200 to form the at least two conductive parts 20 includes forming a photoresist layer PL on the conductive material layer 200. The mask M is disposed above the conductive material layer 200, and the mask M includes light-transmitting openings T and non-light-transmitting parts NT. Patterning the photoresist layer PL to remove the photoresist layer PL corresponding to the light transmission openings T. Patterning the conductive material layer 200 by an etching process to form the at least two conductive parts 20. Peeling the photoresist layer PL corresponding to the non-light-transmitting parts NT.

In the manufacturing method of the display panel provided by the present application, by forming the photoresist layer PL on the conductive material layer 200, and patterning the photoresist layer PL, and then patterning the conductive material layer 200 by the etching process to form conductive parts 20 arranged in the array. Compared with the prior art in which the conductive part is fabricated by the brushing, the precision of fabricating the conductive portion 20 is greatly improved, and the fabrication time of the display panel is greatly shortened.

In some embodiments, patterning the photoresist layer PL includes using the laser L to align the light-transmitting openings T to remove the photoresist layer PL corresponding to the light-transmitting openings T. In the embodiment of the present application, a method of using a laser-L-assisted yellow light to form the plurality of conductive parts 20 arranged in the array. This method combines advantages of high collimation, high energy of laser imaging, and yellow light process, and promotes a rapid industrialization process of mini-LED display panels and micro-LED display panels.

In some embodiments, patterning the photoresist layer PL may further include aligning the light-transmitting openings T by ultraviolet light, so as to remove the photoresist layer PL corresponding to the light-transmitting openings T. In the embodiment of the present application, a yellow light process method is used to form the plurality of conductive parts 20 arranged in the array. This method promotes the rapid industrialization process of the mini-LED display panels and the micro-LED display panels.

In summary, although the present application has been disclosed in preferred embodiments as above, the above-mentioned preferred embodiments are not intended to limit the present application. Those of ordinary skill in the art can make various modifications without departing from the spirit and scope of the present application. Therefore, the protection scope of the present application is subject to the scope defined by the claims.

What is claimed is:

1. A manufacturing method of a display panel, comprising following steps:
providing a substrate, the substrate comprising conductive pads;
forming a conductive material layer on the substrate;
forming a photoresist layer on the conductive material layer;
providing a mask above the conductive material layer, the mask comprising light-transmitting openings and non-light-transmitting parts;
aligning the light-transmitting openings with a laser to remove the photoresist layer corresponding to the light-transmitting openings;
patterning the conductive material layer with an etching process to form at least two conductive parts, wherein the conductive parts are located on the conductive pads;
peeling the photoresist layer corresponding to the non-light-transmitting parts; and
providing at least one light-emitting diode device on the conductive parts.

2. The manufacturing method of the display panel according to claim 1, wherein the step of providing the substrate comprises following steps:
providing a base;
forming a driving circuit layer on the base; and
forming the conductive pads on a surface of the driving circuit layer away from the base.

3. The manufacturing method of the display panel according to claim 2, wherein the substrate comprises a display area and a frame area, the conductive pads comprise at least one first conductive pad and a second conductive pad, a width of one of the first conductive pads is greater than a width of the second conductive pad, the at least one first conductive pad corresponds to the display area, the second conductive pad corresponds to the frame area; the conductive parts comprise at least one first conductive part and a second conductive part, and the at least one first conductive part is disposed on the at least one first conductive pad, the second conductive part is disposed on the second conductive pad.

4. The manufacturing method of the display panel according to claim 3, wherein after the step of patterning the conductive material layer to form the at least two conductive parts, the manufacturing method further comprises a following step:
providing a driving chip on the second conductive part.

5. The manufacturing method of the display panel according to claim 3, wherein one of the at least one light-emitting diode device comprises LED chips and connection pads disposed on the LED chips, and the step of providing the at least one light-emitting diode device on the conductive parts comprises a following step:

provided the connection pads on the at least one first conductive part to form the display panel.

6. A manufacturing method of a display panel, comprising following steps:

providing a substrate, the substrate comprising conductive pads;

forming a conductive material layer on the substrate;

forming a photoresist layer on the conductive material layer;

providing a mask above the conductive material layer, the mask comprising light-transmitting openings and non-light-transmitting parts;

aligning the light-transmitting openings with an ultraviolet light to remove the photoresist layer corresponding to the light-transmitting openings;

patterning the conductive material layer with an etching process to form at least two conductive parts, wherein the conductive parts are located on the conductive pads;

peeling the photoresist layer corresponding to the non-light-transmitting parts; and providing at least one light-emitting diode device on the conductive parts.

7. The manufacturing method of the display panel according to claim 6, wherein the step of providing the substrate comprises following steps:

providing a base;

forming a driving circuit layer on the base; and forming the conductive pads on a surface of the driving circuit layer away from the base.

8. The manufacturing method of the display panel according to claim 7, wherein the substrate comprises a display area and a frame area, the conductive pads comprise at least one first conductive pad and a second conductive pad, a width of one of the first conductive pads is greater than a width of the second conductive pad, the at least one first conductive pad corresponds to the display area, the second conductive pad corresponds to the frame area; the conductive parts comprise at least one first conductive part and a second conductive part, and the at least one first conductive part is disposed on the at least one first conductive pad, the second conductive part is disposed on the second conductive pad.

9. The manufacturing method of the display panel according to claim 8, wherein after the step of patterning the conductive material layer to form the at least two conductive parts, the manufacturing method further comprises a following step:

providing a driving chip on the second conductive part.

10. The manufacturing method of the display panel according to claim 8, wherein one of the at least one light-emitting diode device comprises LED chips and connection pads disposed on the LED chips, and the step of providing the at least one light-emitting diode device on the conductive parts comprises a following step:

providing the connection pads on the at least one first conductive part to form the display panel.

* * * * *